United States Patent
Russell et al.

(10) Patent No.: US 8,004,907 B2
(45) Date of Patent: Aug. 23, 2011

(54) SRAM WITH READ AND WRITE ASSIST

(75) Inventors: Andrew C. Russell, Austin, TX (US);
Troy L. Cooper, Austin, TX (US);
Prashant U. Kenkare, Austin, TX (US);
Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 113 days.

(21) Appl. No.: 12/479,088

(22) Filed: Jun. 5, 2009

(65) Prior Publication Data
US 2010/0309736 A1    Dec. 9, 2010

(51) Int. Cl.
*G11C 11/00* (2006.01)
(52) U.S. Cl. ................... 365/189.011; 365/191
(58) Field of Classification Search ............ 365/189.011, 365/191, 205
See application file for complete search history.

(56) References Cited

U.S. PATENT DOCUMENTS

| | | | |
|---|---|---|---|
| 6,556,471 B2 | 4/2003 | Chappell et al. | |
| 6,704,216 B1 * | 3/2004 | Cheng et al. | 365/49.17 |
| 6,977,859 B2 * | 12/2005 | Takahashi | 365/222 |
| 7,079,426 B2 * | 7/2006 | Zhang et al. | 365/189.02 |
| 7,177,176 B2 | 2/2007 | Zheng et al. | |
| 2001/0010642 A1 * | 8/2001 | Naffziger et al. | 365/154 |
| 2003/0179642 A1 * | 9/2003 | Winograd et al. | 365/233 |
| 2004/0032758 A1 * | 2/2004 | Cheng et al. | 365/49 |
| 2008/0198678 A1 * | 8/2008 | McClure et al. | 365/226 |
| 2009/0109723 A1 * | 4/2009 | Buer et al. | 365/96 |

* cited by examiner

*Primary Examiner* — Michael T Tran
(74) *Attorney, Agent, or Firm* — James L. Clingan, Jr.; Joanna G. Chiu

(57) ABSTRACT

A memory includes an SRAM bitcell including a pair of cross-coupled inverters, wherein a first inverter of the pair includes a first device having a body and a second inverter of the pair includes a second device having a body. A first selection circuit has a first input coupled to a first supply voltage terminal, a second input coupled to a second supply voltage terminal, and an output coupled to a first current electrode of the first device and to a first current electrode of the second device. A second selection circuit has a first input coupled to the first supply voltage terminal, a second input coupled to the second supply voltage terminal, and an output coupled to the body of each of the first and second devices. A word line coupled to the SRAM bitcell is driven by a word line driver coupled to the first supply voltage terminal.

20 Claims, 2 Drawing Sheets

SRAM WITH READ AND WRITE ASSIST

BACKGROUND

1. Field

This disclosure relates generally to static random access memories (SRAMs), and more specifically, to SRAMs with assist for the read and write operations.

2. Related Art

Read and write assist in a static random access memory (SRAM) has been used to improve the reliability of performing reads and writes. The bias conditions on an SRAM cell are different for assisting a read than they are for assisting a write. An effective way of doing this is to provide two bitcell power supplies; one above the normal power supply (VDD) and one below VDD. This, however, results in the need for generating two power supply voltages different from VDD. Further one of them exceeds VDD which further increases complexity in the generation of the voltage.

Thus there is a need to provide read and write assist in an SRAM that improves upon one or more of the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An SRAM that includes bitcells with a pair of P channel transistors uses the normal power supply voltage used for a word line driver and a generated bitcell power supply voltage to assist reads and writes. Each P channel transistor of the pair of P channel transistors have a gate, a source, and a drain as well as a body that can be contacted separately from the source. During a read, the sources are connected to the normal power supply and bodies are connected to a reduced voltage that is lower than the normal power supply. During a write, the sources are connected to the reduced voltage and the bodies are connected to the normal supply voltage. The result is a very effective assist for both the read and the write while using only one voltage different from the normal power supply voltage. This is better understood by reference to the drawings and the following description.

The body described herein may be in a semiconductor substrate of any semiconductor material, combinations of materials, or configuration, such as gallium arsenide, silicon germanium, silicon-on-insulator (SOI), silicon, monocrystalline silicon, fin, planar, or the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
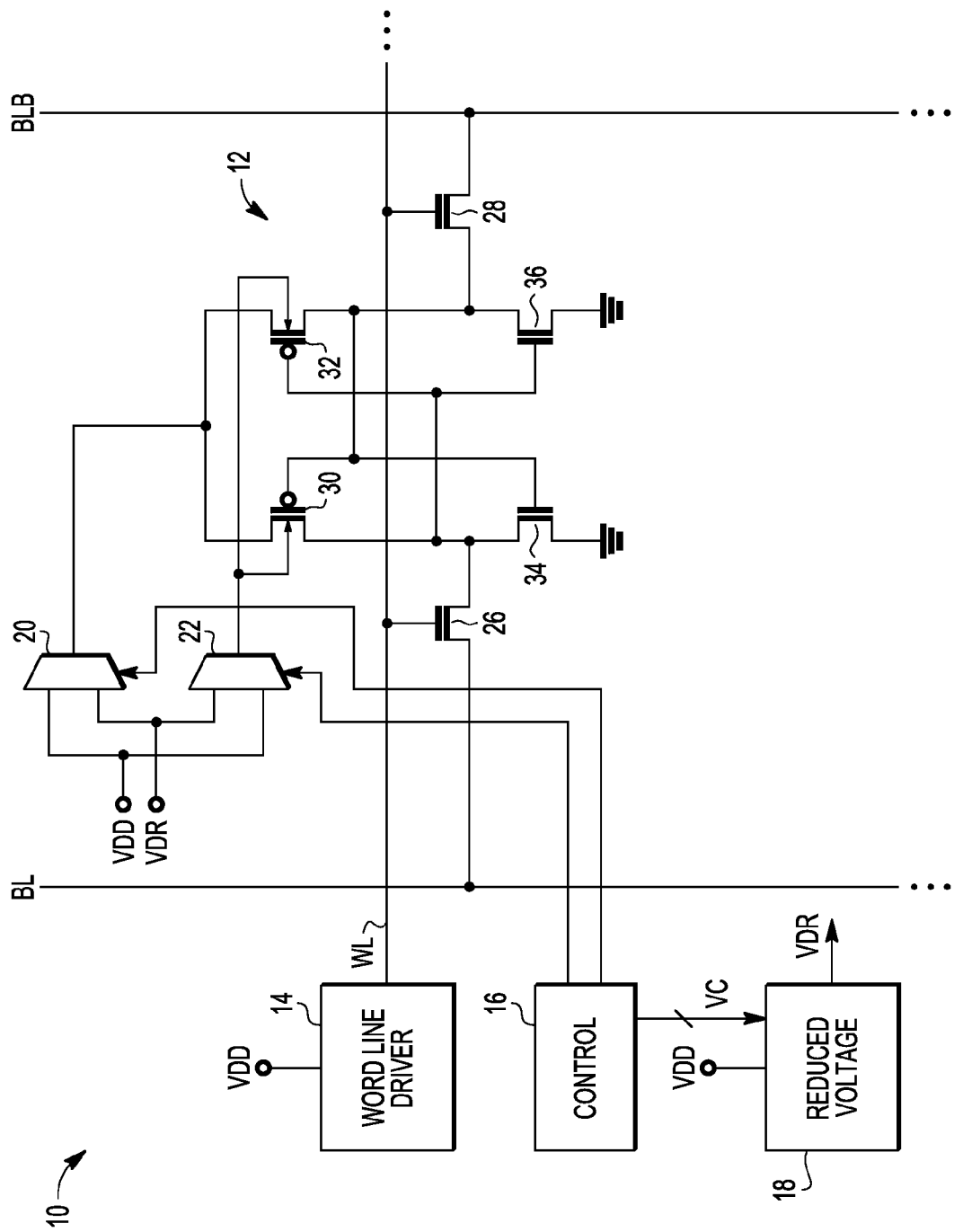
FIG. 1 is a combination block and circuit diagram of a portion of a static random access memory (SRAM) according to an embodiment.

Shown in FIG. 1 is a portion of a memory 10. Although only a portion is shown in FIG. 1, memory 10 is an SRAM having a plurality of memory cells, connected to word lines and bit lines. Decoders, sense amplifiers, and word line drivers are examples of additional circuitry of memory 10. The portion shown in FIG. 10 comprises an SRAM cell 12, a word line driver 14, a control circuit 16, a reduced voltage source 18, a multiplexer 20, and a multiplexer 22. SRAM cell 12 comprises an N channel transistor 26, an N channel transistor 28, a P channel transistor 30, a P channel transistor 32, an N channel transistor 34, and an N channel transistor 36. Word line driver 14 is powered by a positive power supply voltage VDD which is also used to power control circuit 16 and reduced source 18. Word line driver 14 has an output coupled to a word line WL. Word line WL is coupled to a row of SRAM cells including SRAM cell 12. Control circuit 16 has a voltage control output VC coupled to reduced voltage source 18. Control circuit 16 has a first read/write assist signal coupled to a control input of multiplexer 20 and a second read/write assist signal coupled to a control input of multiplexer 22. Reduced voltage source 18 receives VDD and provides a reduced voltage VDR in response to voltage control signal VC. Multiplexer 20 has a first signal input for receiving VDD and a second signal input for receiving VDR, and an output. Multiplexer 22 has a first signal input for receiving VDD and a second signal input for receiving VDR, and an output. Transistor 26 has a gate coupled to word line WL, a first current electrode coupled to a bit line BL, and a second current electrode. Transistor 28 has a gate coupled to word line WL, a first current electrode coupled to a complementary bit line BLB, and a second current electrode. Transistor 30 has a source coupled to the output of multiplexer 20, a body coupled to the output of multiplexer 22, a drain coupled to the second current electrode of transistor 26, and a gate connected to the second current electrode of transistor 28. Transistor 32 has a source coupled to the output of multiplexer 20, a body coupled to the output of multiplexer 22, a drain coupled to the second current electrode of transistor 28, and a gate connected to the second current electrode of transistor 26. Transistor 34 has a drain connected to the second current electrode of transistor 26, a gate coupled to the gate of transistor 30, and a source coupled to ground. Transistor 36 has a drain connected to the second current electrode of transistor 28, a gate coupled to the gate of transistor 32, and a source coupled to ground. Transistors 26 and 28 function as pass gates. Transistors 30 and 34 form an inverter. Transistors 32 and 36 form an inverter. Transistors 30, 32, 34, and 36 form a pair of cross-coupled inverters that may be considered a storage portion of SRAM cell 12. N channel transistors 26, 28, 34, and 36 also have a body that is contacted in conventional fashion with either ground or another bias voltage.

In operation word line driver 14 asserts a signal onto word line WL when the row of memory cells coupled to word line WL is selected by a row decoder. The row decoder is not shown in FIG. 1. For the case where memory cell 12 is to be written, control circuit 16 causes multiplexer 20 to couple VDR to the sources of transistors 30 and 32, and control circuit 16 causes multiplexer 22 to couple VDD to the bodies of transistors 30 and 32. Application of the higher body voltage, which is VDD in this example, results in a higher threshold voltage which in turn results in reduced current drive for transistors 30 and 32 relative to the case in which the body is at lower voltage, VDR in this case. Furthermore, a lower supply voltage, VDR, at the sources results in reduced current drive for transistors 30 and 32. The write is thus more reliably performed because the P channels have reduced current drive. The reduced current drive of P channel transistors 30 and 32 results in the complementary signals provided on bit line BL and complementary bit line BLB being able to more easily change the state stored in the storage portion made up of transistors 30, 32, 34, and 36.

For the case where memory cell 12 is to be read, control circuit 16 causes multiplexer 20 to couple VDD to the sources of transistors 30 and 32, and control circuit 16 causes multiplexer 22 to couple VDR to the bodies of transistors 30 and 32. Application of the lower body voltage, VDR in this example, results in a lower threshold voltage which in turn results in increased current drive for transistors 30 and 32 relative to the case in which the body is at the higher voltage of VDD. Furthermore, a higher supply voltage, VDD in this case, at the sources results in increased current drive for transistors 30 and 32. The read is thus more reliably performed because the P channels have increased current drive. With more current drive in P channel transistors 30 and 32, the logic state of the storage portion of memory cell 12 is less likely to be corrupted when transmission gates 26 and 28 couple bit lines BL and BLB to the storage portion made up of transistors 30, 32, 34, and 36.

Reduced voltage VDR should not be sufficiently below VDD to cause a PN junction to have any significant conductance. The case where the sources are at VDD and the bodies are at VDR results in a forward biased PN junction, but so long as this forward bias is less than a few hundred millivolts, the resulting current is not significant.

Figure 2:
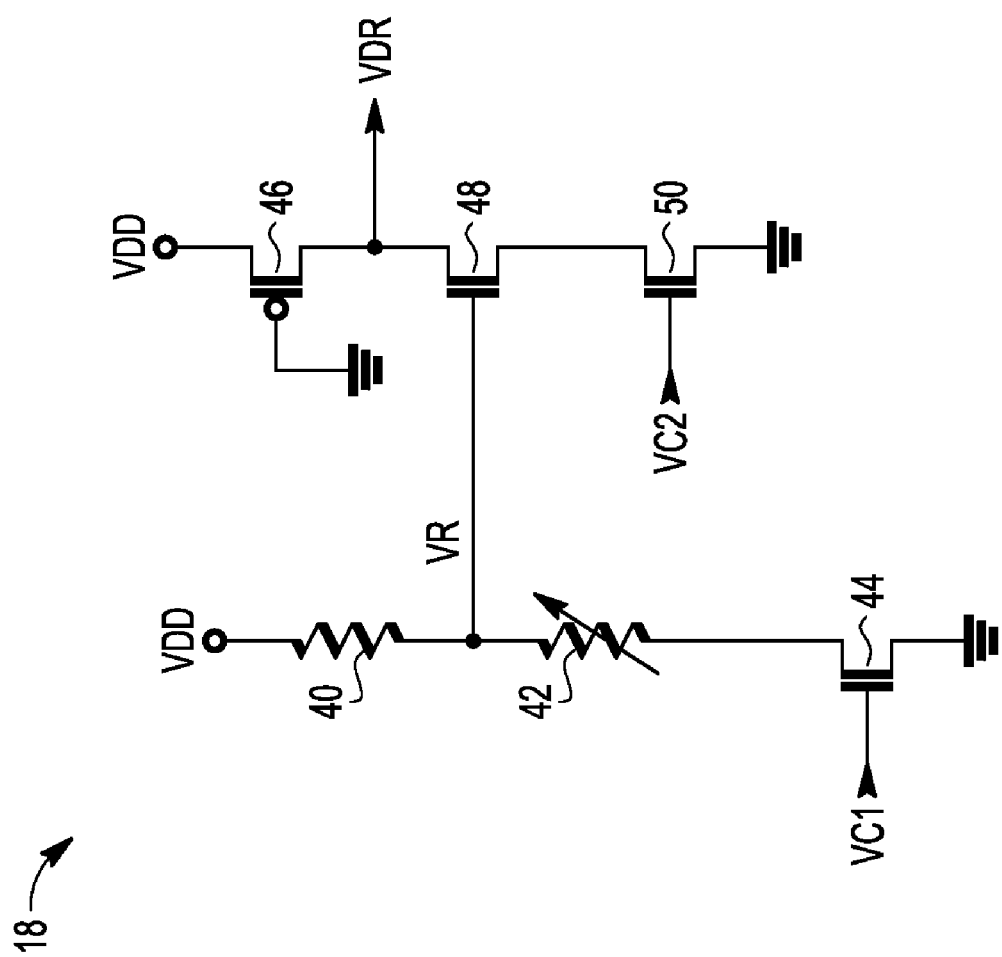
FIG. 2 is a circuit diagram of portion of the embodiment shown in FIG. 1.

Shown in FIG. 2 is reduced voltage source 18 of FIG. 1 in more detail. As shown in FIG. 2, reduced voltage source 18 comprises a resistor 40, a resistor 42, an N channel transistor 44, a P channel transistor 46, an N channel transistor 48, and an N channel transistor 50. Resistor 42 is a variable resistor. Resistor 40 has a first terminal coupled to a power supply terminal that receives VDD and a second terminal. Resistor 42 has a first terminal coupled to the second terminal of resistor 40 and a second terminal. Transistor 44 has a drain coupled to the second terminal of resistor 42, a gate for receiving a voltage control signal VC1, and a source coupled to ground. Voltage control signal VC from control circuit 16 of FIG. 1 comprises a voltage control signal VC1 and a voltage control signal VC2. Transistor 46 has a source connected to the terminal that receives VDD, a gate coupled to ground, and a drain. Transistor 48 has a drain coupled to the drain of transistor 46, a gate coupled to the second terminal of resistor 40, and a source. Transistor 50 has a drain coupled to the source of transistor 48, a gate for receiving voltage control signal VC2, and a source coupled to ground. When voltage control signals VC1 and VC2 are asserted transistors 44 and 50 are conductive. Resistors 40 and 42 function as a voltage divider to provide a reference voltage VR. Transistor 46, with its gate at ground potential, functions as a current source. Transistor 48 is biased by reference voltage VR so that the drains of transistors 46 and 48 provide reduced voltage VDR. Reference voltage VR is selected by varying the resistance of resistor 42. This may be a programmable resistance that can be permanently selected by blowing fuses. Reduced voltage source 18 is relatively simple because the desired voltage for the read and write assist is below VDD, the normal supply voltage. A voltage greater than VDD would require significantly increased complexity in the form of having to generate it on chip with a charge pump or off chip with a voltage regulator and supplying it to the memory via an additional power grid. Also the degree to which reduced voltage source 18 is shared by different SRAM memory cells depends on details of the implementation. For example there may be a reduced voltage source 18 for each memory cell, for each row, for each column, or for each subarray, or all of the SRAM cells may use a single reduced voltage source such as reduced voltage source 18.

During a standby mode, voltage control signals VC1 and VC2 are deasserted so that transistors 44 and 50 are non-conductive. With transistors 44 and 50 non-conductive, there is no current path from VDD to ground in reduced voltage source 18. The result also is that, with transistor 46 still conductive, the output of reduced voltage source 18 is VDD. Thus in the standby mode, both inputs to multiplexers 20 and 22 are at VDD. This results in the sources and bodies of transistors 20 and 22 being at VDD. To further reduce leakage in SRAM cell 12 but at the cost of draining current in reduced voltage source 18, the write assist conditions can be used for standby mode.

By now it should be appreciated that there has been provided a memory. The memory includes a static random access memory (SRAM) bitcell comprising a pair of cross-coupled inverters, wherein a first inverter of the pair of cross-coupled inverters includes a first device having a body and a second inverter of the pair of cross-coupled inverters includes a second device having a body. The memory further includes a first selection circuit having a first input coupled to a first supply voltage terminal, a second input coupled to a second supply voltage terminal, and an output coupled to a first current electrode of the first device and to a first current electrode of the second device. The memory further includes a second selection circuit having a first input coupled to the first supply voltage terminal, a second input coupled to the second supply voltage terminal, and an output coupled to the body of the first device and to the body of the second device. The memory further includes a word line coupled to the SRAM bitcell. The memory further includes a word line driver coupled to the first supply voltage terminal and which drives the word line. The memory may have a further characterization by which a voltage of the second supply voltage terminal is less than a voltage of the first supply voltage terminal. The memory may have a further characterization by which, during a read operation of the SRAM bitcell, the first selection circuit couples the first supply voltage terminal to the first current electrode of the first device and to the first current electrode of the second device and the second selection circuit couples the second supply voltage terminal to the body of the first device and the body of the second device. The memory may have a further characterization by which, during a write operation of the SRAM bitcell, the first selection circuit couples the second supply voltage terminal to the first current electrode of the first device and to the first current electrode of the second device and the second selection circuit couples the second supply voltage terminal to the body of the first device and the body of the second device. The memory may have a further characterization by which, during a standby mode of the SRAM bitcell, the first selection circuit couples the second supply voltage terminal to the first current electrode of the first device and to the first current electrode of the second device and the second selection circuit couples the first supply voltage terminal to the body of the first device and the body of the second device. The memory may have a further characterization by which, during a write operation of the SRAM bitcell, the first selection circuit couples the second supply voltage terminal to the first current electrode of the first device and to the first current electrode of the second device and the second selection circuit couples the first supply voltage terminal to the body of the first device and the body of the second device. The memory may have a further characterization by which, during a write operation of the SRAM bitcell, the first selection circuit couples the second supply voltage terminal to the first current electrode of the first device and to the first current electrode of the second device and the second selection circuit couples the second supply voltage terminal to the body of the first device and the body of the second device. The memory may have a further characterization by which, during a write operation of the SRAM bitcell, the first selection circuit couples the second supply voltage terminal to the first current electrode of the first device and to the first current electrode of the second device and the second selection circuit couples the first supply voltage terminal to the body of the first device and the body of the second device. The memory may further comprise a reduced voltage generator coupled to the first supply voltage terminal and providing the second supply voltage terminal, wherein a voltage level of the second supply voltage terminal is generated from a voltage level of the first voltage supply terminal. The memory may have a further characterization by which, during a standby mode of the SRAM bit cell, the reduced voltage generator is disabled.

Also disclosed is a method for operating an SRAM bitcell having a first P channel device and a second P channel device, the first P channel device having a body and the second P channel device having a body. The method includes during a read operation of the SRAM bitcell, providing a first supply voltage to a first current electrode of the first P channel device and a first current electrode of the second P channel device, and providing a second supply voltage to the body of the first P channel device and the body of the second P channel device. The method further includes during a write operation of the SRAM bitcell, providing the second supply voltage to the first current electrode of the first P channel device and the first current electrode of the second P channel device, and providing one of the first supply voltage or the second supply voltage to the body of the first P channel device and the body of the second P channel device. The method further includes during the read operation and during the write operation, driving a word line coupled to the SRAM bitcell using one of the first supply voltage or the second supply voltage. The method may have a further characterization by which the second supply voltage is less than the first supply voltage. The method may further comprise generating the second supply voltage from the first supply voltage. The method may further comprise during a standby mode of the SRAM bitcell, providing the second supply voltage to the first current electrode of the first P channel device and the first current electrode of the second P channel device, and providing the first supply voltage to the body of the first P channel device and the body of the second P channel device. The method may have a further characterization by which, during the write operation of the SRAM bitcell, the providing the one of the first supply voltage or the second supply voltage to the body of the first P channel device and the body of the second P channel device comprises providing the second supply voltage to the body of the first P channel device and the body of the second P channel device. The method may have a further characterization by which, during the read operation and during the write operation, the driving the word line coupled to the SRAM bitcell using one of the first supply voltage or the second supply voltage comprises driving the word line using the first supply voltage.

Described also is a memory coupled to a first supply voltage terminal and to a second supply voltage terminal. The memory includes a static random access memory (SRAM) bitcell comprising a first P channel device having a body and a second P channel device having a body, and wherein a voltage of the second supply voltage terminal is less than a voltage of the first supply voltage terminal. The memory further includes a word line coupled to the SRAM bitcell. The memory further includes a first multiplexer having a first input coupled to a first supply voltage terminal, a second input coupled to a second supply voltage terminal, and an output coupled to a first current electrode of the first P channel device and to a first current electrode of the second P channel device. The memory further includes a second multiplexer having a first input coupled to the first supply voltage terminal, a second input coupled to the second supply voltage terminal, and an output coupled to the body of the first P channel device and to the body of the second P channel device. The memory includes a mode of operation by which, during a read operation of the SRAM bitcell, the first multiplexer couples the first supply voltage terminal to the first current electrode of the first P channel device and to the first current electrode of the second P channel device and the second multiplexer couples the second supply voltage terminal to the body of the first P channel device and the body of the second P channel device. The memory further includes an operation by which, during a write operation of the SRAM bitcell, the first multiplexer couples the second supply voltage terminal to the first current electrode of the first P channel device and to the first current electrode of the second P channel device and the second multiplexer couples one of the first supply voltage terminal or the second supply voltage terminal to the body of the first P channel device and the body of the second P channel device. The memory may have a further characterization by which, during a standby mode of the SRAM bitcell, the first multiplexer couples the second supply voltage terminal to the first current electrode of the first P channel device and to the first current electrode of the second P channel device and the second multiplexer couples the first supply voltage terminal to the body of the first P channel device and the body of the second P channel device. The memory may further comprise a reduced voltage generator coupled to the first supply voltage terminal and providing the second supply voltage terminal, wherein a voltage level of the second voltage supply terminal is generated from a voltage level of the first voltage supply terminal. The memory may have a further characterization by which, during a standby mode of the SRAM bit cell, the reduced voltage generator is disabled.

Although the invention is described herein with reference to specific embodiments, various modifications and changes can be made without departing from the scope of the present invention as set forth in the claims below. For example, the non-VDD voltage is described as a reduced voltage but a higher voltage than VDD could be used instead. This would still provide some of the benefit, such as requiring only one additional supply to implement read and write assist, but it is still believed to be preferable to use a reduced voltage at least because of simplicity in the design. Also the different voltages were applied to P channel transistors 30 and 32 but N channel pull-down transistors 34 and 36 could be treated similarly. The source connection could be switched between ground and a voltage a little above ground and the bodies could similarly be switched. The circuit shown in FIG. 2 is just one of many approaches that can be used for generating reduced supply VDR. In an alternate embodiment, the resistors 40 and 42 can be replaced by transistors. In yet another embodiment, the reference voltage VR can be generated by a current mirror. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A memory comprising:
   a static random access memory (SRAM) bitcell comprising a pair of cross-coupled inverters, wherein a first inverter of the pair of cross-coupled inverters includes a first device having a body and a second inverter of the pair of cross-coupled inverters includes a second device having a body;
   a first selection circuit having a first input coupled to a first supply voltage terminal, a second input coupled to a second supply voltage terminal, and an output coupled to a first current electrode of the first device and to a first current electrode of the second device;
   a second selection circuit having a first input coupled to the first supply voltage terminal, a second input coupled to the second supply voltage terminal, and an output coupled to the body of the first device and to the body of the second device;
   a word line coupled to the SRAM bitcell; and
   a word line driver coupled to the first supply voltage terminal and which drives the word line.

2. The memory of claim 1, wherein a voltage of the second supply voltage terminal is less than a voltage of the first supply voltage terminal.

3. The memory of claim 2, wherein, during a read operation of the SRAM bitcell, the first selection circuit couples the first supply voltage terminal to the first current electrode of the first device and to the first current electrode of the second device and the second selection circuit couples the second supply voltage terminal to the body of the first device and the body of the second device.

4. The memory of claim 3, wherein, during a write operation of the SRAM bitcell, the first selection circuit couples the second supply voltage terminal to the first current electrode of the first device and to the first current electrode of the second device and the second selection circuit couples the second supply voltage terminal to the body of the first device and the body of the second device.

5. The memory of claim 4, wherein, during a standby mode of the SRAM bitcell, the first selection circuit couples the second supply voltage terminal to the first current electrode of the first device and to the first current electrode of the second device and the second selection circuit couples the first supply voltage terminal to the body of the first device and the body of the second device.

6. The memory of claim 3, wherein, during a write operation of the SRAM bitcell, the first selection circuit couples the second supply voltage terminal to the first current electrode of the first device and to the first current electrode of the second device and the second selection circuit couples the first supply voltage terminal to the body of the first device and the body of the second device.

7. The memory of claim 1, wherein, during a write operation of the SRAM bitcell, the first selection circuit couples the second supply voltage terminal to the first current electrode of the first device and to the first current electrode of the second device and the second selection circuit couples the second supply voltage terminal to the body of the first device and the body of the second device.

8. The memory of claim 1, wherein, during a write operation of the SRAM bitcell, the first selection circuit couples the second supply voltage terminal to the first current electrode of the first device and to the first current electrode of the second device and the second selection circuit couples the first supply voltage terminal to the body of the first device and the body of the second device.

9. The memory of claim 1, further comprising a reduced voltage generator coupled to the first supply voltage terminal and providing the second supply voltage terminal, wherein a voltage level of the second supply voltage terminal is generated from a voltage level of the first voltage supply terminal.

10. The memory of claim 9, wherein, during a standby mode of the SRAM bit cell, the reduced voltage generator is disabled.

11. A method for operating an SRAM bitcell having a first P channel device and a second P channel device, the first P channel device having a body and the second P channel device having a body, the method comprising:
   during a read operation of the SRAM bitcell, providing a first supply voltage to a first current electrode of the first P channel device and a first current electrode of the second P channel device, and providing a second supply voltage to the body of the first P channel device and the body of the second P channel device;
   during a write operation of the SRAM bitcell, providing the second supply voltage to the first current electrode of the first P channel device and the first current electrode of the second P channel device, and providing one of the first supply voltage or the second supply voltage to the body of the first P channel device and the body of the second P channel device; and
   during the read operation and during the write operation, driving a word line coupled to the SRAM bitcell using one of the first supply voltage or the second supply voltage.

12. The method of claim 11, wherein the second supply voltage is less than the first supply voltage.

13. The method of claim 11, further comprising:
   generating the second supply voltage from the first supply voltage.

14. The method of claim 11, further comprising:
   during a standby mode of the SRAM bitcell, providing the second supply voltage to the first current electrode of the first P channel device and the first current electrode of the second P channel device, and providing the first supply voltage to the body of the first P channel device and the body of the second P channel device.

15. The method of claim 14, wherein, during the write operation of the SRAM bitcell, the providing the one of the first supply voltage or the second supply voltage to the body of the first P channel device and the body of the second P channel device comprises providing the second supply voltage to the body of the first P channel device and the body of the second P channel device.

16. The method of claim 11, wherein, during the read operation and during the write operation, the driving the word line coupled to the SRAM bitcell using one of the first supply voltage or the second supply voltage comprises driving the word line using the first supply voltage.

17. A memory coupled to a first supply voltage terminal and to a second supply voltage terminal, comprising:
   a static random access memory (SRAM) bitcell comprising a first P channel device having a body and a second P channel device having a body, and wherein a voltage of the second supply voltage terminal is less than a voltage of the first supply voltage terminal;
   a word line coupled to the SRAM bitcell;
   a word line driver coupled to the first supply voltage terminal and which drives the word line;
   a first multiplexer having a first input coupled to a first supply voltage terminal, a second input coupled to a second supply voltage terminal, and an output coupled to a first current electrode of the first P channel device and to a first current electrode of the second P channel device;
   a second multiplexer having a first input coupled to the first supply voltage terminal, a second input coupled to the second supply voltage terminal, and an output coupled to the body of the first P channel device and to the body of the second P channel device, wherein:
      during a read operation of the SRAM bitcell, the first multiplexer couples the first supply voltage terminal to the first current electrode of the first P channel device and to the first current electrode of the second P channel device and the second multiplexer couples the second supply voltage terminal to the body of the first P channel device and the body of the second P channel device, and
      during a write operation of the SRAM bitcell, the first multiplexer couples the second supply voltage terminal to the first current electrode of the first P channel device and to the first current electrode of the second P channel device and the second multiplexer couples one of the first supply voltage terminal or the second supply voltage terminal to the body of the first P channel device and the body of the second P channel device.

18. The memory of claim 17, wherein, during a standby mode of the SRAM bitcell, the first multiplexer couples the second supply voltage terminal to the first current electrode of the first P channel device and to the first current electrode of the second P channel device and the second multiplexer couples the first supply voltage terminal to the body of the first P channel device and the body of the second P channel device.

19. The memory of claim 17, further comprising a reduced voltage generator coupled to the first supply voltage terminal and providing the second supply voltage terminal, wherein a voltage level of the second voltage supply terminal is generated from a voltage level of the first voltage supply terminal.

20. The memory of claim 19, wherein, during a standby mode of the SRAM bit cell, the reduced voltage generator is disabled.

* * * * *